United States Patent [19]
Schrems et al.

[11] Patent Number: 5,945,704
[45] Date of Patent: Aug. 31, 1999

[54] TRENCH CAPACITOR WITH EPI BURIED LAYER

[75] Inventors: Martin Schrems, Langebrueck, Germany; Jack Mandelman, Stormville; Joachim Hoepfner, Poughkeepsie, both of N.Y.; Herbert Schaefer, Hoehenkirchen, Germany; Reinhard Stengl, Stadtbergen, Germany

[73] Assignees: Siemens Aktiengesellschaft, Munich, Germany; International Business Machines Corporation, Armonk, N.Y.

[21] Appl. No.: 09/105,945

[22] Filed: Jun. 26, 1998

Related U.S. Application Data

[63] Continuation-in-part of application No. 09/056,119, Apr. 6, 1998.

[51] Int. Cl.[6] .......................... H01L 27/108; H01L 27/76; H01L 31/119
[52] U.S. Cl. ............................................ 257/301; 257/296
[58] Field of Search ..................................... 257/296–313; 438/243–252, 389, 607; 361/303, 305

[56] References Cited

U.S. PATENT DOCUMENTS

| 5,629,226 | 5/1997 | Ohtsuki ..................................... 438/389 |
| 5,731,226 | 3/1998 | Lin et al. ................................. 438/607 |

FOREIGN PATENT DOCUMENTS 363102351  5/1988  Japan .

Primary Examiner—Minh Loan Tran
Assistant Examiner—Cuong Quang Nguyen
Attorney, Agent, or Firm—Stanton C. Braden

[57] ABSTRACT

A trench capacitor with an epi layer in the lower portion of the trench. The epi layer serves as the buried plate of the trench capacitor. A diffusion region surrounds the lower portion of the trench to enhance the dopant concentration of the epi layer. The diffusion region is formed by, for example, gas phase doping, plasma doping, or plasma immersion ion implantation.

10 Claims, 9 Drawing Sheets

TRENCH CAPACITOR WITH EPI BURIED LAYER

This is a continuation-in-part of U.S. Ser. No. 09/056,119, titled "TRENCH CAPACITOR WITH EPI BURIED LAYER," which was filed on Apr. 6, 1998.

FIELD OF INVENTION

The invention generally relates to device and device fabrication and, more particularly, to a trench capacitor.

BACKGROUND OF INVENTION

Integrated circuits (ICs) or chips employ capacitors for charge storage purposes. An example of an IC that employs capacitors for storing charge is a memory IC, such as a dynamic random access memory (DRAM) chip. The level of the charge ("0" or "1") in the capacitor represents a bit of data.

A DRAM chip includes an array of memory cells interconnected by rows and columns. Typically, the row and column connections are referred to as wordlines and bitlines, respectively. Reading data from or writing data to the memory cells is accomplished by activating the appropriate wordlines and bitlines.

Typically, a DRAM memory cell comprises a transistor connected to a capacitor. The transistor includes two diffusion regions separated by a channel, above which is located a gate. Depending on the direction of current flow between the diffusion regions, one is referred to as the drain and the other the source. The terms "drain" and "source" are herein used interchangeably to refer to the diffusion regions. The gate is coupled to a wordline, one diffusion region is coupled to a bitline, and the other diffusion region is coupled to the capacitor.

Applying an appropriate voltage to the gate switches the transistor "on," enabling current to flow through the channel between the diffusion regions to form a connection between the capacitor and bitline. Switching off the transistor severs this connection by preventing current from flowing through the channel.

One type of capacitor that is commonly employed in DRAMs is the trench capacitor. A trench capacitor is a three-dimensional structure formed in the substrate. Typically, a trench capacitor comprises a deep trench etched into the substrate. The trench is filled, for example, with n-type doped poly. The doped poly serves as one electrode of the capacitor (referred to as the "storage node"). An n-type doped region surrounds the lower portion of the trench, serving as a second electrode. The doped region is referred to as a "buried plate." A node dielectric separates the buried plate and the storage node.

A conventional technique for forming the buried plate includes outdiffusing dopants into the region of the substrate surrounding the lower portion of the trench. The dopant source is typically provided by an n-type doped silicate glass such as, for example, arsenic doped silicate glass (ASG).

After formation of the buried plate, the node dielectric is deposited to line the sidewalls of the trench. However, conventional techniques for forming a buried plate result in the trench sidewalls having a relatively rough surface. The rough surface of the trench sidewalls degrades the quality of the node dielectric, adversely affecting yields.

From the above discussion, it is desirable to provide a trench capacitor having reduced surface roughness in the trench sidewalls.

SUMMARY OF INVENTION

The invention relates to an improved trench capacitor, such as one employed in a memory cell. In one embodiment, the trench capacitor is employed in a DRAM cell of, for example, a DRAM or an embedded DRAM chip. The trench capacitor comprises an epitaxial layer lining the lower portion of the trench. In one embodiment, the epitaxial (epi) layer is doped to serve as a buried plate of the capacitor. A diffusion region is provided in the lower portion of the trench. Above the epi buried plate is a dielectric collar. A node dielectric lines the collar and epi buried plate, isolating the storage node of the trench capacitor from the buried plate. An epi spacer layer may be provided to provide separation between the doped epi buried plate and the substrate.

DETAILED DESCRIPTION OF THE INVENTION

The present invention relates to ICs in general and, more particularly to trench capacitors. Such ICs include, for example, memory ICs such as random access memories (RAMs), dynamic RAMs (DRAMs), synchronous DRAMs (SDRAMs), static RAMs (SRAMs), and read only memories (ROMs) or other memory ICs. Other ICs include logic devices such as programmable logic arrays (PLAs), application specific ICs (ASICs), merged logic/memory ICs (embedded DRAMs), or any circuit devices.

Typically, a plurality of ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and other products. For purposes of discussion, the invention is described in the context of forming a single cell.

For purposes of discussion, the present invention is described in the context of a DRAM cell. However, the invention extends to formation of trench capacitors in general. To better understand the invention, a description of a conventional trench capacitor DRAM cell is provided.

Figure 1:
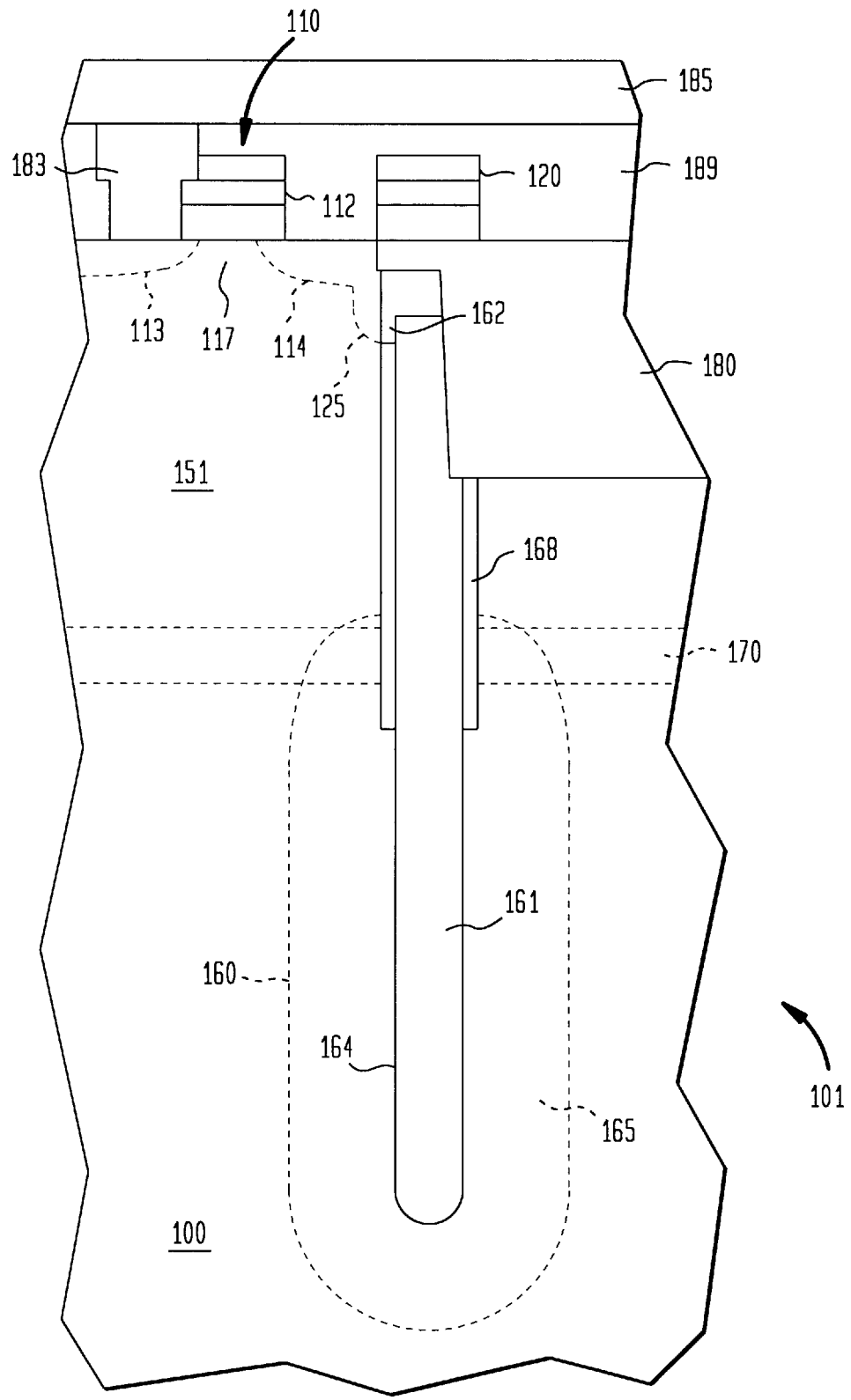
FIG. 1 shows a conventional DRAM cell.

Referring to FIG. 1, a conventional trench capacitor DRAM cell 100 is shown. Such a conventional trench capacitor DRAM cell is described in, for example, Nesbit et al., *A 0.6 $\mu m^2$ 256 Mb Trench DRAM Cell With Self-Aligned Buried Strap (BEST)*, IEDM 93–627, which is herein incorporated by reference for all purposes. Typically, wordlines and bitlines interconnect a plurality of memory cells, forming a cell array in a DRAM chip.

The DRAM cell comprises a trench capacitor 160 formed in a substrate 101. The substrate is lightly doped with p-type dopants (p⁻), such as boron (B). The trench is filled with, typically, polysilicon (poly) 161 heavily doped with n-dopants (n⁺), such as arsenic (As) or phosphorous (P). A buried plate 165 doped with, for example, As is provided in the substrate surrounding the lower portion of the trench. The As is diffused into the silicon substrate from a dopant source, such as ASG, that is formed on the sidewalls of the trench. The poly and buried plate serve as the electrodes of the capacitor. A node dielectric 164 separates the electrodes.

The DRAM cell also comprises a transistor 110. The transistor includes gate 112 and diffusion regions 113 and 114. The diffusion regions, which are separated by a channel, are formed by implanting n-type dopants such as phosphorus (P). A node diffusion region 125, referred to as the "node junction," couples the capacitor to the transistor. The node diffusion region is formed by out diffusing dopants from the trench poly through a buried strap 162.

A collar 168 is formed at an upper portion of the trench. As used herein, the upper portion of the trench refers to the section that includes the collar, and the lower portion refers to the section below the collar. The collar prevents leakage of the node junction to the buried plate. Leakage is undesirable as it degrades the retention time of the cell.

A buried well 170 comprising n-type dopants, such as P or As, is provided below the surface of the substrate. The peak concentration of dopants in the buried n-well is at about the bottom of the collar. Typically, the well is lightly doped compared to the buried plate. The buried well serves to connect the buried plates of the DRAM cells in the array.

Activating the transistor by applying the appropriate voltages at the gate and bitline accesses the trench capacitor. Generally, the gate forms a wordline and the diffusion region 113 is coupled to a bitline 185 in the DRAM array via a contact 183. The bitline 185 is isolated from the diffusion region by an interlevel dielectric layer 189.

A shallow trench isolation (STI) 180 is provided to isolate the DRAM cell from other cells or devices. As shown, a wordline 120 is formed over the trench and isolated therefrom by the STI. Wordline 120 is referred to as the "passing wordline." Such a configuration is referred to as a folded bitline architecture.

Figure 2A:
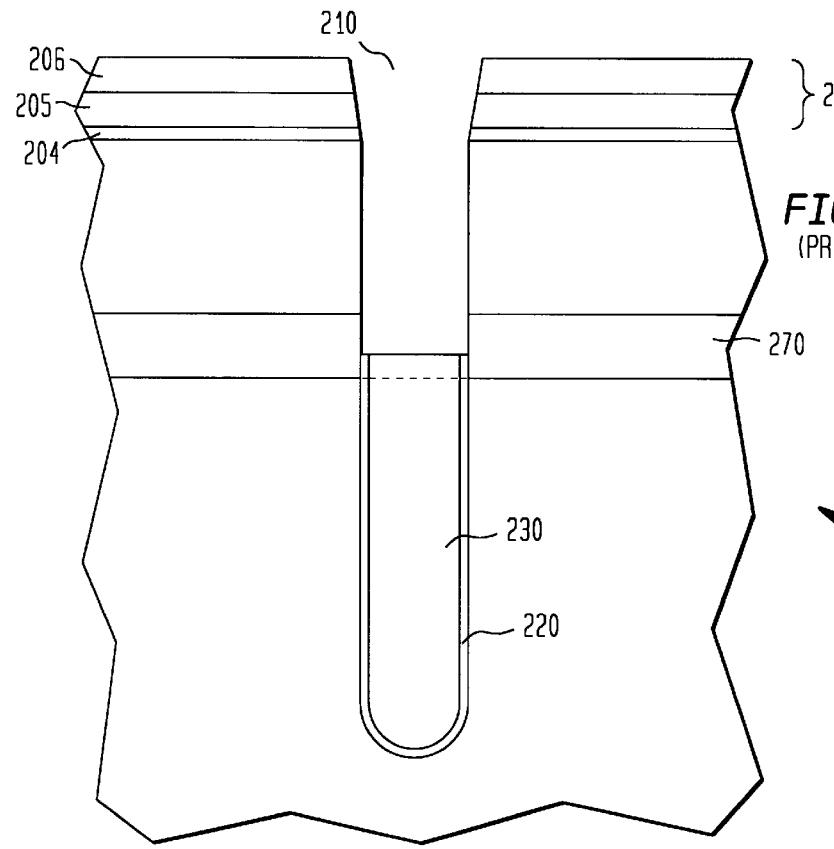
FIGS. 2a–b show a conventional process for forming a buried plate in a DRAM cell.
Figure 2B:
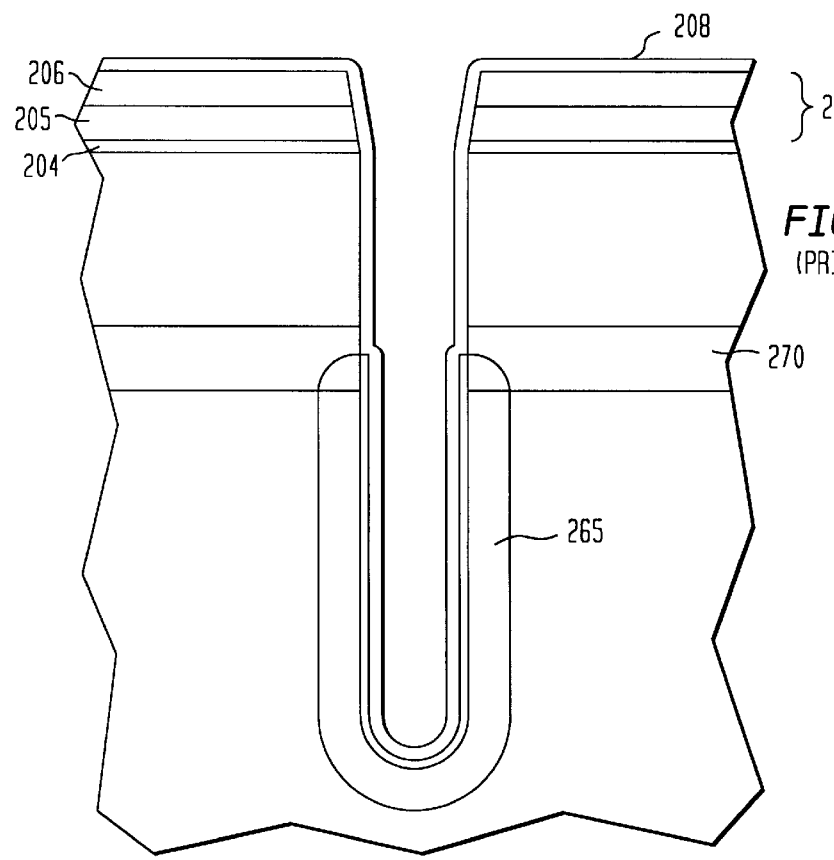

FIGS. 2a–b show a conventional process for forming a buried plate of a DRAM cell. Referring to FIG. 2a, a pad stack 207 is formed on the surface of the substrate 201. The pad stack comprises various layers such as a pad oxide 204 and pad stop layer 205. The pad stop layer comprises, for example, nitride. The pad stack also includes a hard mask layer 206 formed above the pad stop layer. The hard mask serves as an etch mask for forming the trench. The pad stack is patterned using conventional lithographic and etch techniques to define a region in which a trench 210 is to be formed.

Formation of the trench is accomplished by an anisotropic etch such as reactive ion etching (RIE). The trench is then lined with an ASG layer 220, serving as a dopant source for forming the buried plate. A thin TEOS layer may be formed over the ASG to ensure that there is good adhesion with a deposited resist layer 230 that fills the trench. The resist is recessed, exposing the ASG layer in the upper portion of the trench. The exposed ASG is removed by a wet etch process.

Referring to FIG. 2b, the remaining portion of the resist is removed from the trench selective to the ASG. A dielectric layer 208 comprising, for example, TEOS is deposited over the trench. The TEOS layer prevents As atoms from autodoping the exposed upper portion of the silicon sidewalls. An anneal is performed to outdiffuse the As atoms from the ASG into the silicon, creating a buried plate 265. The top portion of the buried plate contacts a buried n-well 270. After the formation of the buried plate, the remaining portion of the DRAM is fabricated to result in, for example, a DRAM cell as shown in FIG. 1.

Figure 3:
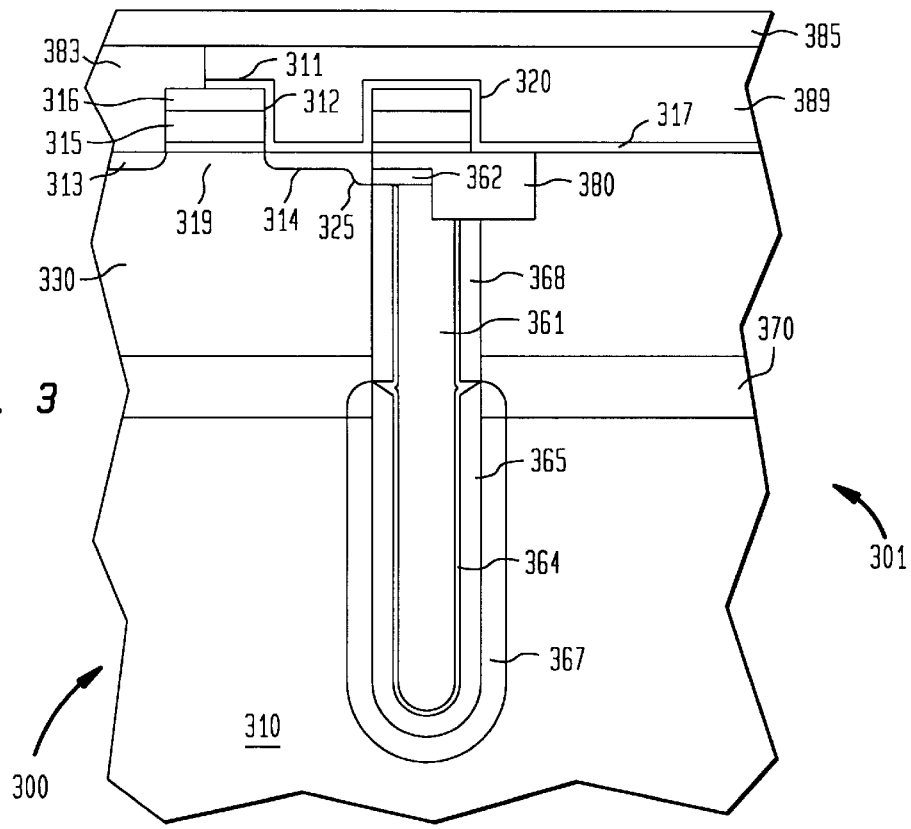
FIG. 3 shows a DRAM cell in accordance with one embodiment of the invention.

FIG. 3 shows an embodiment of the invention. As shown, a DRAM cell 300 includes a trench capacitor 310. Illustratively, the DRAM cell is a merged isolation node trench (MINT) cell. Other trench cell configurations that employ a buried plate are also useful. For a 256 megabit DRAM chip with feature size (F) of about 0.25 $\mu$m, the dimensions of the trench capacitor are about 7–8 $\mu$m deep, 0.25 $\mu$m wide, and 0.50 $\mu$m long, with a unit cell dimension of about 0.605 $\mu$m². Of course, the dimensions can vary depending on design requirements and design rules. For example, a DRAM chip with feature size (F) of about 0.15 $\mu$m, the dimensions of the trench capacitor are about 7–8 $\mu$m deep, 0.15 $\mu$m wide, and 0.30 $\mu$m long, with a unit cell dimension of about 0.2 $\mu$m².

As shown, the trench capacitor is formed in a substrate 301 such as a silicon wafer. Other types of semiconductor substrates are also useful. The substrate, for example, is lightly doped with dopants having an electrical type. In one embodiment, the substrate is doped with p-type dopants such as B. Also, the use of n-type dopants such as As or P to lightly dope the substrate is also useful. More lightly or more heavily doped substrates are also useful, depending on design requirements and applications. A heavily doped substrate with a lightly doped epi portion is also useful.

Typically, the trench comprises poly 361 heavily doped with dopants having a second electrical type. The poly is heavily doped with, for example, n-type dopants (n⁺) such as As or P. In one embodiment, the poly is heavily doped with As. The concentration of As is about $1-2\times10^{19}$ cm⁻³.

An epitaxial silicon (epi) layer 365 lines the lower portion of the trench below collar 368. The epi layer starts, for example, at about 1.2 $\mu$m below the substrate surface. This distance depends on the collar and p-well depth.

The epi layer is doped with dopants having the second electrical type. In one embodiment, the epi is doped with n-type dopants such as As or P. The epi layer serves as the buried plate of the capacitor. Alternatively, the epi layer 365 may comprise a plurality of epi layers. A description of a trench capacitor having an epi buried plate is provided in the U.S. patent application Ser. No. 09/056,119, titled "TRENCH CAPACITOR WITH EPI BURIED LAYER," which is herein incorporated by reference for all purposes.

A node dielectric layer 364 separates the electrodes of the capacitor. In one embodiment, the dielectric layer comprises nitride/oxide. Oxide/nitride/oxide or other suitable dielectric layers or stack of layers such as oxide, nitridized oxide, or NONO are also useful. As shown, the dielectric layer lines the collar and epi layer.

By lining the lower portion of the trench with the epi layer, the roughness of the surface on which the node dielectric is formed is reduced. Reducing the surface roughness decreases the random enhancement of the electric field in the node dielectric and the introduction of random defects, providing a tighter distribution of capacitor breakdown voltage compared to capacitors having a relatively rougher surface. This improves manufacturing yields.

In accordance with one embodiment of the invention, a diffusion region 367 surrounds the lower portion of the trench. The diffusion region comprises dopants of the same electrical type as the poly 361, for example n-type dopants such as As or P. The diffusion region serves as a dopant source from which dopants diffuse into the epi buried plate 365. Providing a dopant source enhances or increases the dopant concentration of the epi buried plate. Increasing the dopant concentration of the buried plate avoids or reduces loss of capacitance due to electrical depletion of majority carriers, which in this case are electrons, from the surface of the storage electrode. Increasing the dopant concentration also reduces series resistance, avoiding degradation in read/write time.

Connecting the epi buried plate 365 of the capacitor to other capacitors within the DRAM array is a buried well 370 comprising dopants of second electrical type. In one embodiment, the buried well is formed by implanting n-type dopants, such as As or P. The concentration of the well is about $1 \times 10^{17}$–$1 \times 10^{20}$ cm$^{-3}$. The buried well can also be formed with an n-type epi layer. A reference voltage is coupled to the buried well, connecting the buried plates of the capacitors in the DRAM array to a common reference voltage. This reduces the maximum electric field in the dielectric layer, thus improving reliability. In one embodiment, the reference voltage is midway between the bitline low and high voltage limits, commonly referred to as $V_{DD}/2$. Other reference voltages such as ground are also useful. Also, a reference voltage that is equal to the substrate bias voltage is useful, particularly with heavily doped substrates such as p−/p+ substrates.

A strap 362 is provided above the doped poly. Dopants from the doped poly 361 outdiffuse into the silicon, forming a node diffusion region 325 or node junction to couple the transistor and capacitor. Although the illustrative embodiment is described with a buried strap, other types of couplings such as a surface strap are also useful.

A collar 368 is provided in the upper portion of the trench and extends to about the top of the buried plate. As shown, the collar is slightly recessed below the substrate surface to accommodate a buried strap 362. The collar comprises a dielectric material. In one embodiment, the collar comprises a thermal oxide layer underneath a TEOS layer. A thermal oxide collar is also useful. In some embodiments, a nitride layer lines the surface of the collar. The collar prevents or reduces leakage from the node junction to the buried plate. In one embodiment, the collar is about 1.2 µm deep and 20–90 nm thick.

An STI 380 is provided in a top portion of the trench to isolate the DRAM cell from other cells in the array and to prevent strap formation between adjacent capacitors. As shown, the STI overlaps a portion of the trench, leaving a remaining portion to permit current to flow between the transistor and capacitor. In one embodiment, the STI nominally overlaps about half the trench width. The STI prevents or reduces strap to strap leakage. The depth of the STI is about 0.25 µm.

A p-type doped well 330 is provided in the substrate below the transistor 311 to prevent punchthrough. The transistor 311 comprises a gate stack 312 and drain/source diffusion regions 313 and 314 separated by a channel region 319. The diffusion regions comprise n-type dopants, such as As or P. Diffusion region 314 is coupled to the node junction 325. The gate stack, also referred to as the "wordline," comprises poly 315 layer. Typically, the poly is doped with either n or p-type dopants. Optionally, a metal silicide layer (not shown) is formed over the poly layer to reduce sheet resistance of the gate stack. The poly and silicide are sometimes referred to as "polycide."

As shown, the gate stack is capped with a nitride layer 316 that is used as an etch mask for isolating the wordline. Additionally, sidewall oxide (not shown) and a liner 317 are used to isolate the wordline. The liner, for example, comprises nitride or other suitable material. The liner also serves as an etch stop during the formation of a borderless contact 383. The borderless contact provides a connection between diffusion 313 and a bitline 385. A dielectric layer 389, such as BPSG or another dielectric material such as oxide, isolates the bitline from the diffusion regions. Typically, a barrier or liner layer (not shown) lines the contact opening to isolate the contact stud from the gate.

A passing wordline 320 is formed about an STI 380. The passing wordline is isolated from the trench by the STI and a thick cap oxide. In one embodiment, the edges of the passing wordline are substantially aligned with the trench sidewalls. Such a configuration is referred to as a folded bitline architecture. Other configurations such as, for example, open or open-folded architectures are also useful. Additionally, other cell designs using, for example, vertical transistors, are also useful.

In accordance with another embodiment of the invention, an epi spacer layer is preferably provided in the lower portion of the trench between the trench sidewalls and epi buried plate. The epi spacer layer is initially undoped or lightly doped with dopants having the second electrical type, such as As or P. The epi spacer layer is used to define the diffusion region. In one embodiment, the diffusion region is formed substantially within the epi spacer layer. This can easily be achieved, for example, by lowering the thermal budget and/or providing a sufficiently thick spacer layer. Using an epi spacer layer to define the diffusion region is particularly useful in applications with heavily doped substrates or lightly doped epi with heavily doped substrates. The epi spacer layer produces a more graded p/n junction between the substrate and buried plate, thereby reducing leakage. Furthermore, the spacer layer facilitates the formation of a buried plate with higher dopant concentration.

As described, the first electrical type is p-type, and the second electrical type is n-type. The invention is also applicable to trench capacitors having p-type poly formed in an n-type substrate. Furthermore, it is possible to heavily or lightly dope the substrate, wells, buried plate, and other elements of the DRAM cell with impurity atoms in order to achieve the desired electrical characteristics.

As described in FIG. 3, the trench capacitor includes a buried plate formed with an epi layer or a plurality of epi layers. The epi layer or layers, for example, are selectively formed on the lower portion of the trench. A diffusion region is advantageously provided to enhance the dopant concentration of the epi layer. In one embodiment, the collar of the trench capacitor is formed prior to the selective epi growth and node dielectric deposition. Forming the collar prior to the selective epi growth advantageously provides a buried-plate that is self-aligned to the collar. Techniques such as "collar first process" are useful in forming the collar prior to forming the buried plate. Such techniques are described in, for example, U.S. Pat. No. 5,656,535 to Ho et al. and U.S. Pat. No. 5,264,716 to Kenney, which are herein incorporated by reference for all purposes. Other techniques which employ a two step trench etch are also useful.

FIGS. 4a–f show the process for forming a DRAM cell in accordance with an embodiment of the invention. The invention is described in the context of a memory cell with an n-channel device. The invention is also useful for applications using p-channel devices.

Figure 4A:
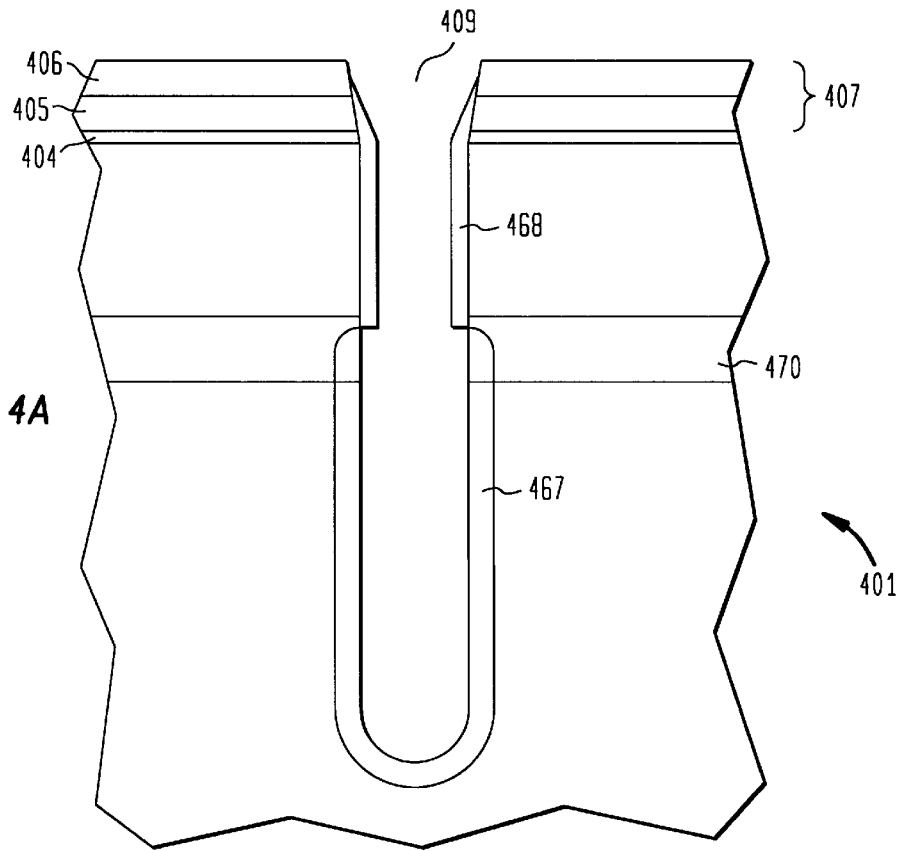
FIGS. 4a–f show a process in accordance with one embodiment of the invention for forming the DRAM cell of FIG. 3.

Referring to FIG. 4a, a substrate 401 is provided on which the DRAM cell is fabricated. The substrate, for example, comprises silicon. Other types of semiconductor substrates are also useful. Typically, the substrate is lightly doped with, for example, p-type dopants (p−) such as B. The concentration of the B is about $1-2\times10^{16}$ atoms/cm$^{-3}$. Higher concentrations of B, which produce a heavily doped p-type (p+) substrate, are also useful. The use of p−/p+ epi substrate is useful. Typically, the epi portion is about 2–3 um thick with a dopant concentration of about $10^{16}-10^{17}$ atoms cm$^{-3}$. To avoid outdiffusion of dopants from the p+ or p−/p+ substrates, the backside of the wafer can be sealed with an oxide layer formed by a low temperature oxide (LTO) deposition process. The use of lightly or heavily doped n-type substrates is also useful.

The substrate can also include an n-type buried well 470. The buried well comprises P or As dopants. In one embodiment, a mask is patterned to define the buried well regions. N-type dopants, such as P, are implanted into the buried well regions of the substrate. Typically, the buried well regions are located below the array devices but not the support devices. The implant is performed with sufficient energy and dose to deposit the peak concentration of P dopants in the bottom region of a collar that is formed. The buried well serves to isolate the p-well from the substrate and also forms a conductive bridge between the epi-plates. The concentration and energy of the phosphorus implant is about $>1\times10^{13}$ cm$^{-2}$ at about 1.5 MeV. Alternatively, the buried well is formed by implanting dopants and then growing an epi layer above the substrate surface. Such a technique is described in U.S. Pat. No. 5,250,829 to Bronner et al., which is herein incorporated by reference for all purposes.

Typically, a pad stack 407 is formed on the surface of the substrate. The pad stack comprises, for example, a pad oxide layer 404 and a polish stop layer 405. The polish stop layer serves as a polish or etch stop for subsequent processes and may comprise, for example, nitride. The pad stack also includes a hard mask layer 406, typically comprising TEOS. Other materials, such as BSG, are also useful for the hard mask layer. The hard mask layer is patterned using conventional lithographic and etch techniques to define a region in which a trench 409 is then formed.

In the upper portion of the trench is a dielectric collar 468. In one embodiment, the collar comprises thermal oxide underneath CVD TEOS. Typically, the thickness of the collar is about 20–50 nm. Alternatively, the dielectric layer comprises thermal oxide. The collar may also include a nitride liner formed over the oxide.

In accordance with one embodiment of the invention, a diffusion region 467 surrounds the lower portion of the trench. The diffusion region is formed by depositing dopants in the lower portion of the trench sidewalls. The diffusion region comprises dopants of the same electrical type as the dopants used for form the storage node. In one embodiment, the diffusion region comprises n-type dopants such as P or As.

The diffusion region serves as a dopant source to enhance the dopant concentration of the epi buried plate. Increasing the dopant concentration of the buried plate avoids or reduces loss of capacitance due to electrical depletion of majority carriers, which in this case are electrons, from the surface of the storage electrode. Increasing the dopant concentration also reduces series resistance, avoiding degradation in read/write time.

In one embodiment, the diffusion region surrounding the bottom portion of the trench is formed by, for example, gas phase doping. Other techniques such as plasma doping (PLAD) and plasma immersion ion implantation (PIII) are also useful. Such techniques are described in, for example, copending U.S. patent application Ser. No. 09/031,995 (attorney docket number 98P7430 US), titled "IMPROVED TECHNIQUES FOR FORMING TRENCH CAPACITORS IN AN INTEGRATED CIRCUIT," which is herein incorporated by reference for all purposes. The collar advantageously serves as a dopant mask, providing a diffusion region 467 that is self-aligned.

The surface concentration of the diffusion region is, for example, greater than the dopant concentration of the substrate. In one embodiment, the surface concentration of the diffusion region is greater than about $1\times10^{18}$ atoms/cm$^3$, preferably greater than about $1\times10^{20}$ atoms/cm$^3$, and more preferably greater than about $1\times10^{22}$ atoms/cm$^3$. In another embodiment, the surface concentration is about $5\times10^{18}-1\times10^{20}$ atoms/cm$^2$. In yet another embodiment, the surface concentration is about $5\times10^{18}-1\times10^{22}$ atoms/cm$^2$. The surface junction depth of the diffusion region is about 10–70% of F, preferably about 30–60% of F. For example, the junction depth is about 15–100 nm and preferably about 45–90 nm when F is about 150 nm.

In one embodiment, the diffusion region comprises n-type dopants such as As deposited by gas phase doping. Typical conditions of the As gas phase doping include, for example, introducing about 2.4% volume of AsH$_3$ (As source) with a carrier gas at a pressure of about to 760 Torr and temperature of about 900–1100° C. for about 60 seconds. The process conditions, of course, can be optimized for specific applications to obtain the dopant concentrations that result in the desired operating characteristics. The use of P dopants is also useful to form the n-type diffusion region. P-type dopants such as B can be used to form a p-type diffusion region if desired, such as capacitors with p-type storage nodes.

In another embodiment, the diffusion region is formed by PLAD. As or P dopants are deposited on the lower trench sidewalls unprotected by the collar to form the n-type diffusion region. In one embodiment, the dopants are deposited by PLAD with the following parameters: doping energy of about 1 KeV, 10 W, pulse length of about 100 Hz, pressure of about 10–300 MTorr, and current of about 20 mA. The doping time for As dopants is about 1–3 minutes. Typically, the doping time for P dopants is shorter than for As dopants. PLAD with B dopants to form a p-type diffusion region is performed with, for example, doping energy of about 0.7–5 KeV, 10 W, pulse length of about 100 Hz, pressure of about 15–300 mTorr, current of about 15–70 mA, and duration of about 1–5 minutes. Such doping conditions have resulted in a diffusion region with a dopant concentration of about $1\times10^{21}$ atoms/cm$^3$. Of course, the parameters can be varied to achieve the desired dopant concentration. For example, the dopant concentration can be increased or decreased by adjusting the various parameters.

The diffusion region can also be formed by depositing dopants using PIII. In one embodiment, n-type dopants such as P or As are deposited by PIII with the following parameters: doping energy of about 100 eV–20 Kev, 150 W, pulse rate of about 100 Hz–12.5 kHz, pressure of about 0.5–5 MTorr, wafer temperature of about 120–250° C., and a doping time of about 2–70 seconds. Such doping conditions have resulted in a surface concentration of about $5\times10^{18}$ atoms/cm$^3-1\times10^{22}$ atoms/cm$^3$. Of course, the parameters can be varied to achieve the desired dopant concentration. For example, the dopant concentration can be increased or decreased by adjusting the various parameters.

A hydrogen prebake can be performed to remove any native oxide prior to formation of an epi layer in the lower portion of the trench. Typically, a hydrogen prebake is used after gas phase doping. The hydrogen prebake is useful, for example, where different tools are used for the doping or epi growth. This scenario typically results in a thin oxide film forming on the silicon trench sidewalls due to exposure to oxygen during the transfer from one tool to another. The prebake is performed, for example, at a temperature of about 900° C. for about 20 seconds at a pressure of about 20 Torr with about 25 slm of $H_2$.

Figure 4B:
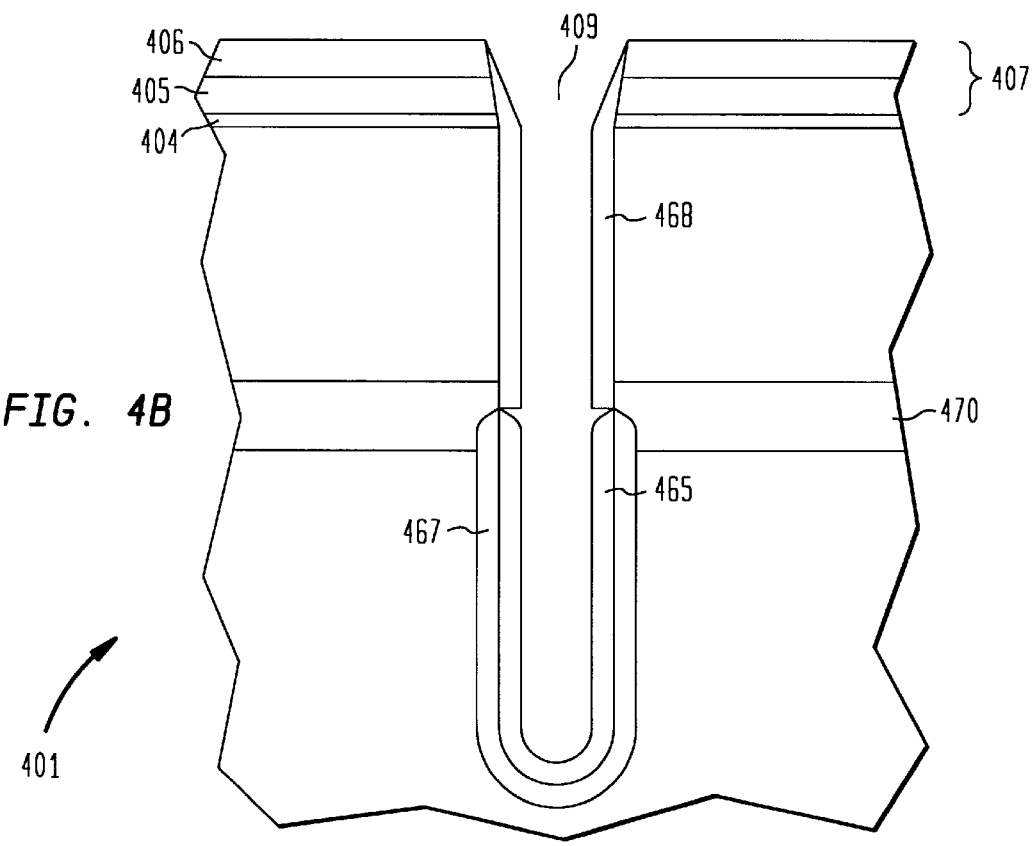

Referring to FIG. 4b, an epi layer 465 is deposited in the portion of the trench below the collar. The epi layer is doped with n-type dopants such as P or As. The epi layer, in one embodiment, is formed selective to the oxide. Such technique is referred to as selective epi growth (SEG). SEG is described in, for example, Wolf, *Silicon Processing for the VLSI Era*, Vol. 2, Lattice Press, 1990, which is herein incorporated by reference for all purposes. SEG forms the epi on exposed silicon. As a result, epi is formed on the exposed sidewalls in the lower portion of the trench while the collar and pad stack as a mask prevent epi growth thereon.

The epi layer is deposited, in one embodiment, by rapid thermal chemical vapor deposition (RTCVD). Other chemical vapor deposition techniques are also useful for depositing the epi layer. Various silicon sources or precursors, such as silicon tetrachloride ($SiCl_4$), dichlorosilane ($SiH_2Cl_2$), trichlorosilane ($SiHCl_3$), and silane ($SiH_4$), are useful for growing epi. Hydrogen ($H_2$) serves as a dilutant; and hydrogen chloride (HCl) gas is used to enhance the selectivity of the epi growth.

In one embodiment, the epi layer is in-situ doped with dopants during epi growth. Insitu doped is achieved by flowing dopants into the reactor during growth. For example, $PH_3$ (P source) or $AsH_3$ (As source) is introduced into the reactor to provide an n-doped epi layer. A p-type epi layer can also be used. $B_2H_6$ is used as the p-type dopant source for a p-type epi layer. Such, p-type epi layer may be useful with p-channel array devices. To achieve a sufficiently high growth rate of typically about 5–50 nm/min, the deposition temperatures are between about 850–1050° C. Of course, temperatures can be varied to achieve higher or lower growth rates by increasing or decreasing the temperature. Selectivity is controlled by varying HCl and $H_2$ flows and/or during epi formation. Also, the dopant concentration can be varied within the desired ranges to increase or decrease selectivity of the epi growth. Depositing an undoped or lightly doped epi layer is also useful since the diffusion region can serve as a source from which dopants can diffuse into the epi layer.

The dopant concentration of the buried plate depends on design requirements. For example, it is desirable to provide a highly doped buried plate that is thicker than the space charge region as it effectively prevents the current flow in the presence of a voltage bias. The dopant concentration is greater than about $1\times10^{18}$ atoms/cm$^3$. The dopant concentration is, for example, from about $1\times10^{18}$–$1\times10^{21}$ atoms/cm$^3$. Typically, the dopant concentration is about $1\times10^{19}$–$1\times10^{20}$ atoms/cm$^3$.

The desired thickness of the buried layer depends on design requirements and dopant concentration. Typically, the desired thickness is about 1–10 nm. Of course, the thickness may vary for different applications. The desired thickness of the epi layer is inversely related to the dopant concentration therein. Higher dopant concentrations enable the use of a thinner epi layer. Conversely, lower dopant concentrations result in the use of a thicker epi layer. For example, an epi layer with a dopant concentration of about $4\times10^{19}$ atoms/cm$^{-3}$ is greater than or equal to about 4 nm thick.

In some embodiments, an undoped or lightly doped (p−) epi spacer layer (not shown) is optionally provided between the substrate and the more heavily doped epi buried plate. The epi spacer layer is particularly useful when a heavily doped substrate is employed. The spacer layer improves the separation of dopants between the n+ epi buried plate and the p+ substrate. The thickness of the spacer layer is, for example, about 1–10 nm.

Figure 4C:
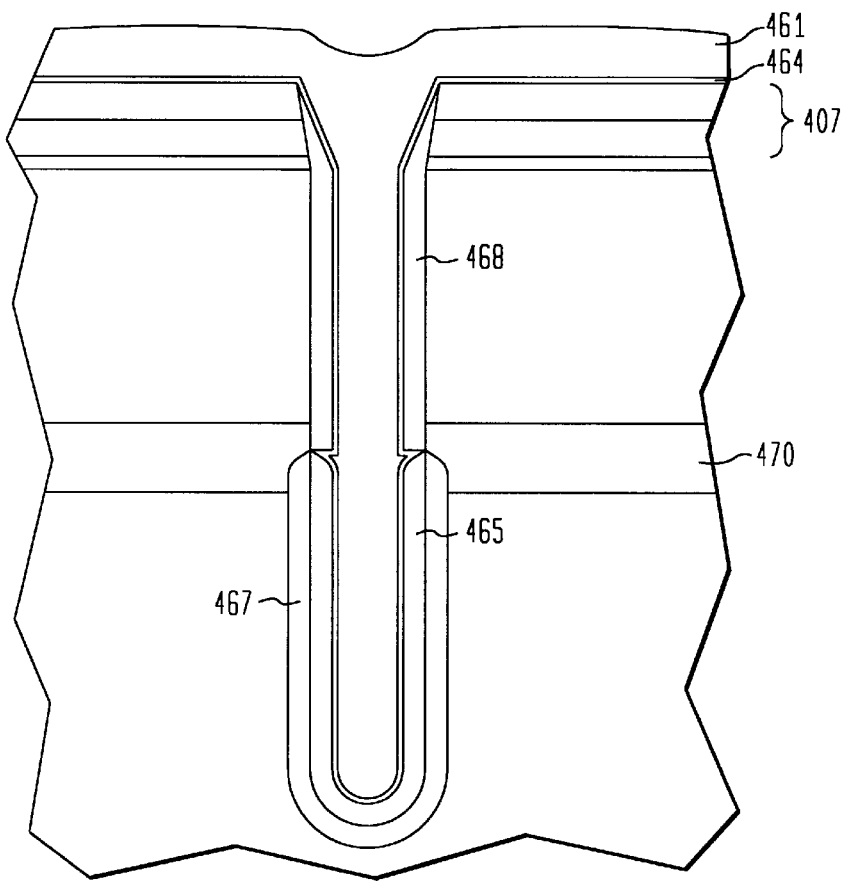

In FIG. 4c, a dielectric layer 464 is formed over the surface of the wafer, covering the interior of the trench including the collar and epi buried plate. The dielectric layer serves as the node dielectric, separating the electrodes of the capacitor. In one embodiment, the dielectric comprises a nitride/oxide (NO) film stack. The NO film stack is formed by, for example, depositing a nitride layer. CVD in an FTP tool may be used to deposit the nitride layer. Typically, the thickness of nitride layer is about 5 nm. The nitride layer is then oxidized at a temperature of about 900° C. to densify it. The oxidation process results in a NO layer having essentially the same or slightly increased thickness as the nitride layer. The use of a NO layer improves the quality of the node dielectric. Other dielectric film or film stacks such as oxide, oxynitride, oxide/nitride/oxide (ONO), oxide/nitride/oxide/nitride (ONON), or nitride/oxide/nitride/oxide (NONO) are also useful.

A poly layer 461 is deposited on the surface of the wafer, filling the trench and covering the pad stack. The poly is deposited by, for example, CVD. As shown, the poly layer is conformal. The poly layer is insitu doped with n-type dopants, such as P and As. In one embodiment, the poly layer is doped with As. The concentration of As in the poly layer is about $1\times10^{19}$–$1\times10^{20}$ atoms/cm$^{-3}$. The doped poly serves as the node electrode of the capacitor.

Figure 4D:
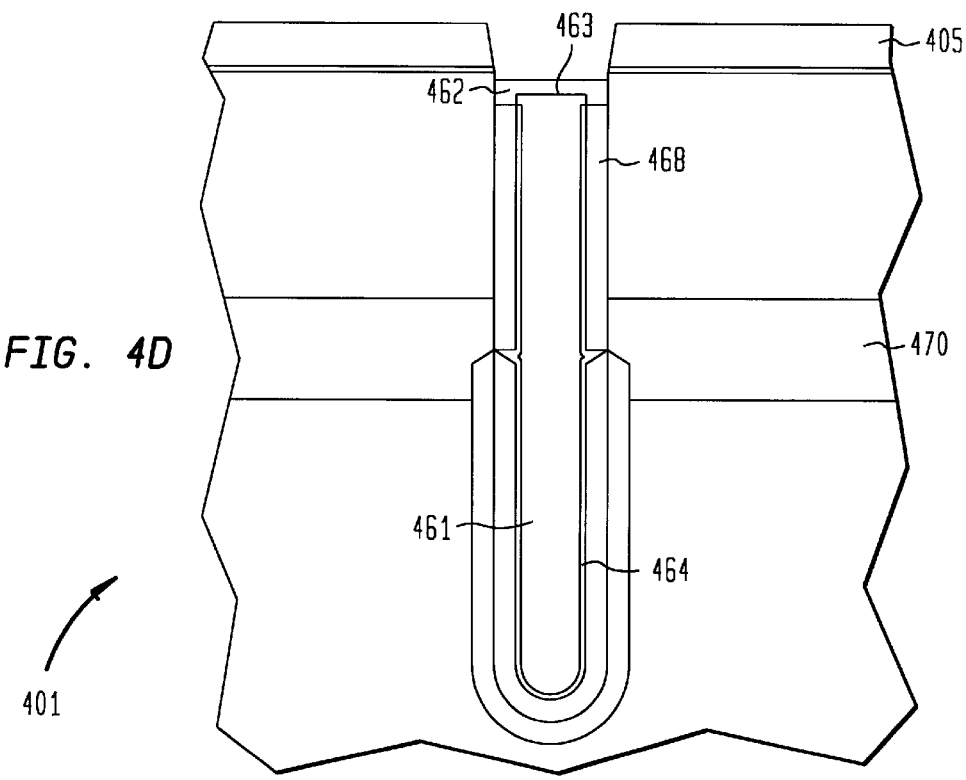

Referring to FIG. 4d, excess poly and hard mask are removed by, for example, a sequence of etch and polishing steps. Polishing techniques such as chemical mechanical polishing (CMP) are useful. The pad stop layer 405 serves as a CMP stop layer, causing the polishing to stop once it reaches the nitride layer. A substantially planar surface between the nitride layer 405 and trench poly is produced for subsequent processing. In some embodiments, the hard mask can be removed earlier in the process flow.

After the surface of the wafer is planarized, the doped poly 461 in the trench is recessed by, for example, reactive ion etching (RIE) to form the buried strap. In one embodiment, the poly is recessed to about 100 nm below the silicon surface. The recess exposes an upper portion of the collar 468. The exposed portion of the collar is removed, typically by a wet etch. The wet etch overetches the collar, recessing it below a top surface 463 of the poly 461. Typically, the overetch recessed the collar about 50 nm below the poly. Other techniques for forming the buried strap are also useful.

A poly layer 462 is deposited on the substrate, covering the nitride layer and filling the recessed portion of the trench. Typically, the poly layer is an intrinsic or undoped poly layer. Amorphous silicon is also useful for filling the trench. Layer 462 may also be doped, depending on design requirements, to reduce resistivity. The poly layer is planarized down to the nitride layer. After planarization, the poly in the trench is recessed to, for example, about 50 nm below the surface of the substrate, forming the buried strap 462. In the example described above, the buried strap is about 10 nm thick. Of course, the various recessed can be optimized to result in a buried strap as specified by design requirements. Other techniques for forming a buried strap is also useful.

Figure 4E:
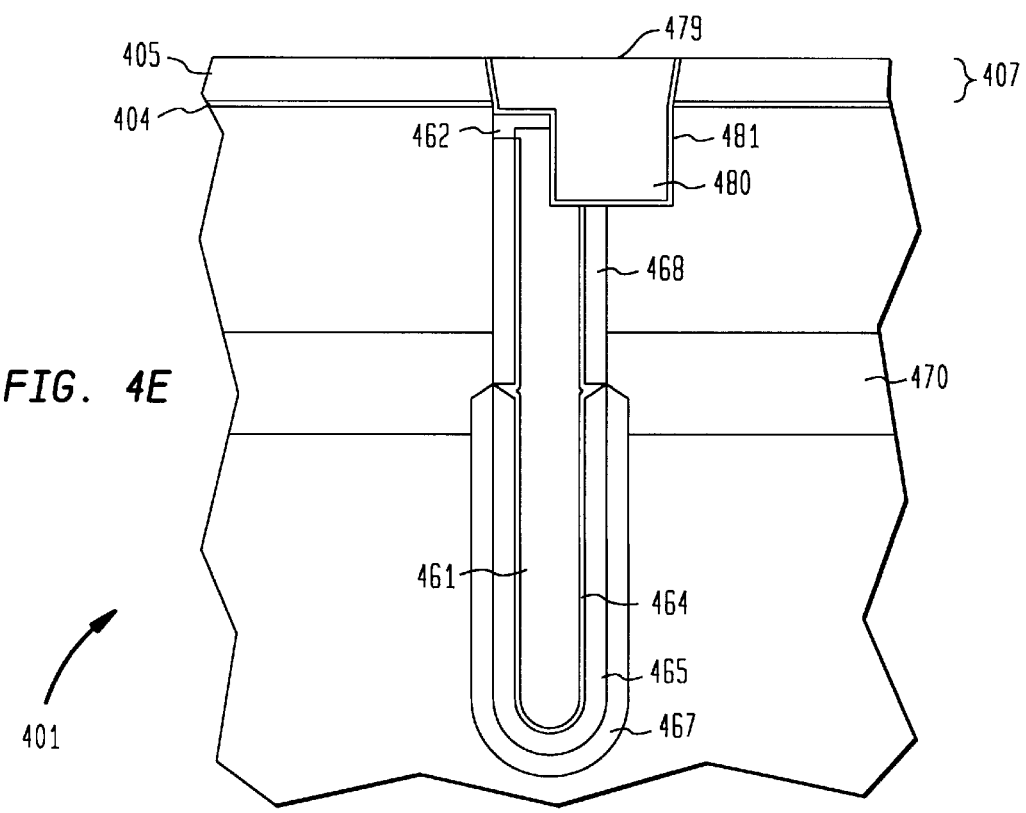

In FIG. 4e, the active area of the DRAM cell is defined. An anti-reflective coating (ARC) layer is deposited on the substrate surface, covering the nitride layer and strap. The ARC is used to improve the resolution of the lithographic process for defining the active area (AA). A resist layer is formed about the ARC layer, serving as an AA etch mask. The active region is then defined by conventional lithographic technique. The nonactive region of the cell is then anisotropically etched by, for example, RIE to form a shallow trench 479 therein. The nonactive region is the region where an STI is to be formed.

As shown, the nonactive region overlaps a portion of the trench, cutting off part of the strap. A remaining portion of the buried strap allows current to flow between the storage node and node junction. Typically, the STI overlaps about half the trench width. The depth of the STI is below the buried strap to prevent strap to strap leakage between adjacent cells. The depth of the STI is about 0.25 μm below the silicon surface.

After the non-active region is etched, the resist and ARC layers are removed. To ensure that no resist or ARC residues remain, clean steps may be employed. To prevent oxygen from diffusing into the silicon and poly sidewalls, a nitride liner 481 is provided to protect the nonactive region. Typically, a passivation oxide is thermally grown on the exposed silicon prior to forming the nitride liner. The nitride liner is formed by, for example, low pressure chemical vapor deposition (LPCVD). The nitride liner is formed over the substrate surface, covering the nitride layer and nonactive STI region.

A dielectric material 480 is deposited on the surface of the substrate, filling the shallow trench 479. The dielectric material, for example, comprises $SiO_2$. In one embodiment, the dielectric material is TEOS. The thickness of the dielectric layer is sufficient to fill the nonactive region. The surface of the substrate is polished so that the top surfaces of the STI and the nitride are substantially planar.

Figure 4F:
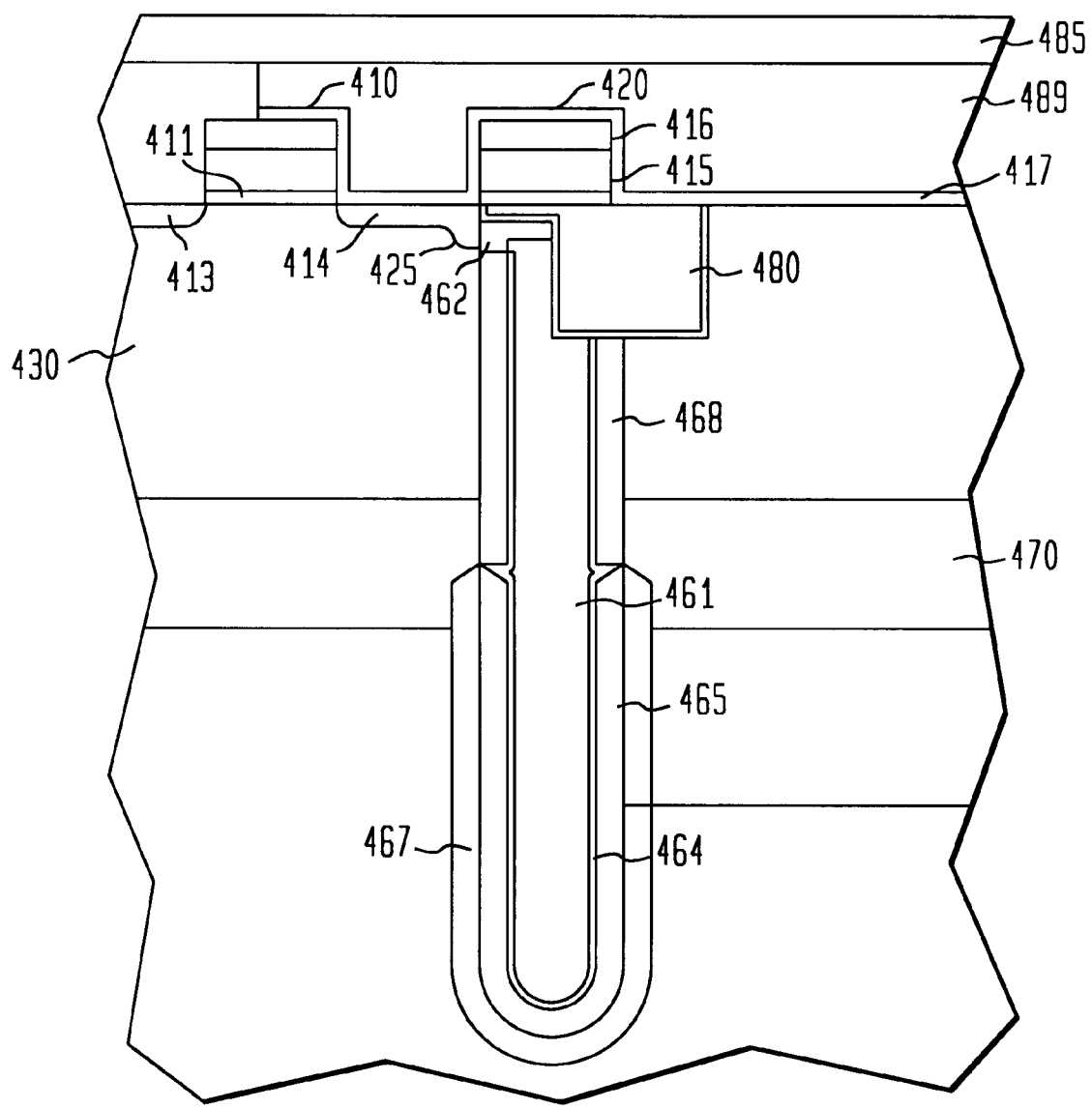

Referring to FIG. 4f, the pad nitride layer is then removed by, for example, a wet chemical etch. The wet chemical etch is selective to oxide. The pad oxide is also removed at this point by a wet chemical etch selective to silicon. After removal of the pad oxide, an oxide layer is formed on the surface of the wafer. The oxide layer, referred to as a "gate sacrificial layer", serves as a screen oxide for subsequent implants.

To define a region for a p-type well 430 for the n-channel access transistor of the DRAM cell, a resist layer is deposited on top of the oxide layer and appropriately patterned to expose the p-well region. As shown, p-type dopants, such as boron (B) are implanted into the well region. The dopants are implanted sufficiently deep to prevent punchthrough and to reduce sheet resistance. The dopant profile is tailored to achieve the desired electrical characteristics, e.g., gate threshold voltage ($V_t$).

In addition, p-type wells for n-channel support circuitry are also formed. For complimentary wells in complimentary metal oxide silicon (CMOS) devices, n-type wells (n-wells) are formed. Additional lithographic and implant steps are required for defining and forming n-wells. As with the p-wells, the profile of the n-wells is tailored to achieve the desired electrical characteristics. After the wells have been formed, the gate sacrificial layer is removed. The doped wells can also be formed earlier in the process flow. Forming the doped wells earlier in the process flow is also useful.

Various layers that form the gate of the transistor are deposited over the substrate. Such layers include, for example, a gate oxide 411, a poly 415 (which can include a silicide such as $WSi_x$, where x=2–3), and a nitride 416. These layers are then patterned to form the gate stack of the transistor 410. A passing gate stack 420 is typically formed over the trench and isolated therefrom by the STI and oxide on top of the trench. Diffusion regions 413 and 414 are formed by implanting n-type dopants such as P or As. In one embodiment, P dopants are implanted into the source and drain regions. The dose and energy is chosen to produce a dopant profile that achieves the desired operating characteristics. To improve diffusion and alignment of the diffusion regions to the gate, nitride spacers (not shown) may be employed. To connect the transistor to the trench, a node junction 425 is created by outdiffusing dopants through the strap 462.

A dielectric layer 489 is formed over the wafer surface and planarized, covering the gates and substrate surface. The dielectric layer, for example, comprises BPSG. Other dielectric layers, such as TEOS, are also useful. A liner layer 417 comprising nitride, for example, is formed prior to the dielectric layer 489 to serve as an etch stop for forming a borderless contact opening. As shown, the borderless contact opening 483 is etched to expose the diffusion region 413. The contact opening is then filled with a conductive material, such as n+ doped polysilicon or other conductive material, forming a contact stud therein. A metal layer, representing a bitline 485, is formed over the dielectric layer, making contact with the diffusion region via the contact stud.

Alternatively, a surface strap instead of a buried strap is used. The use of a surface strap does not require the recessing of the poly to form the buried strap as described above with FIG. 4d. Techniques for forming a surface strap to connect the capacitor with the transistor are well known and will not be described.

Figure 5A:
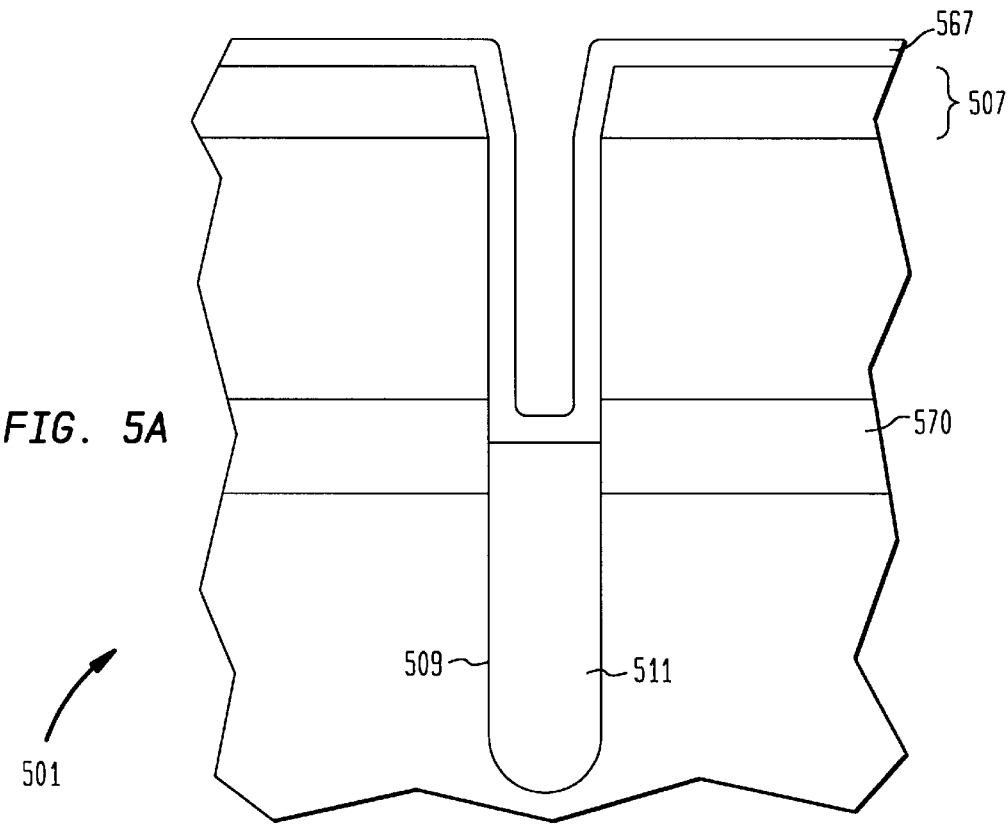
FIGS. 5a–c show a process for forming a collar in accordance with one embodiment of the invention.
Figure 5B:
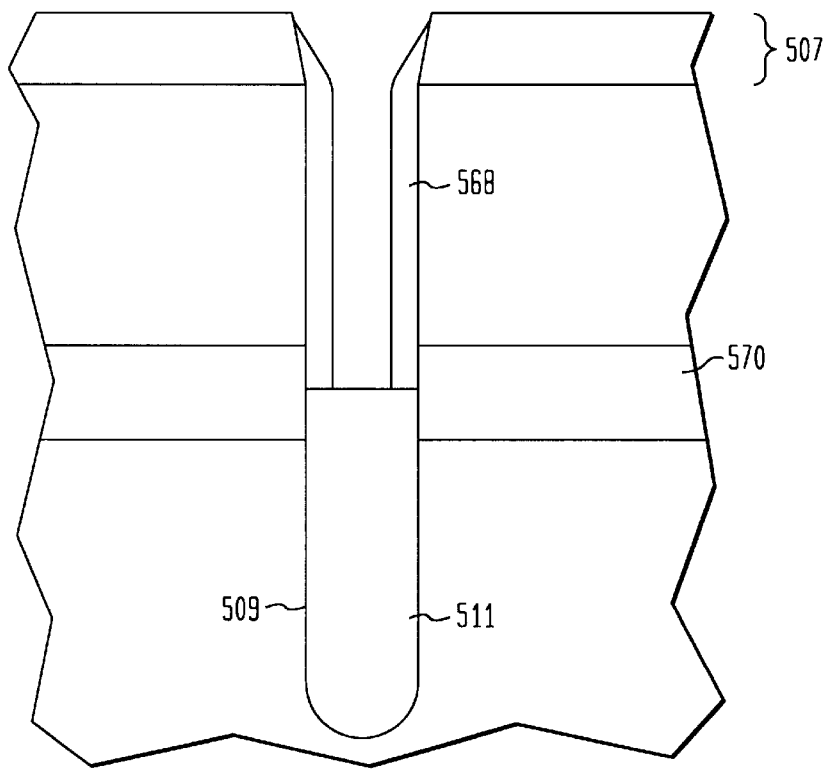
Figure 5C:
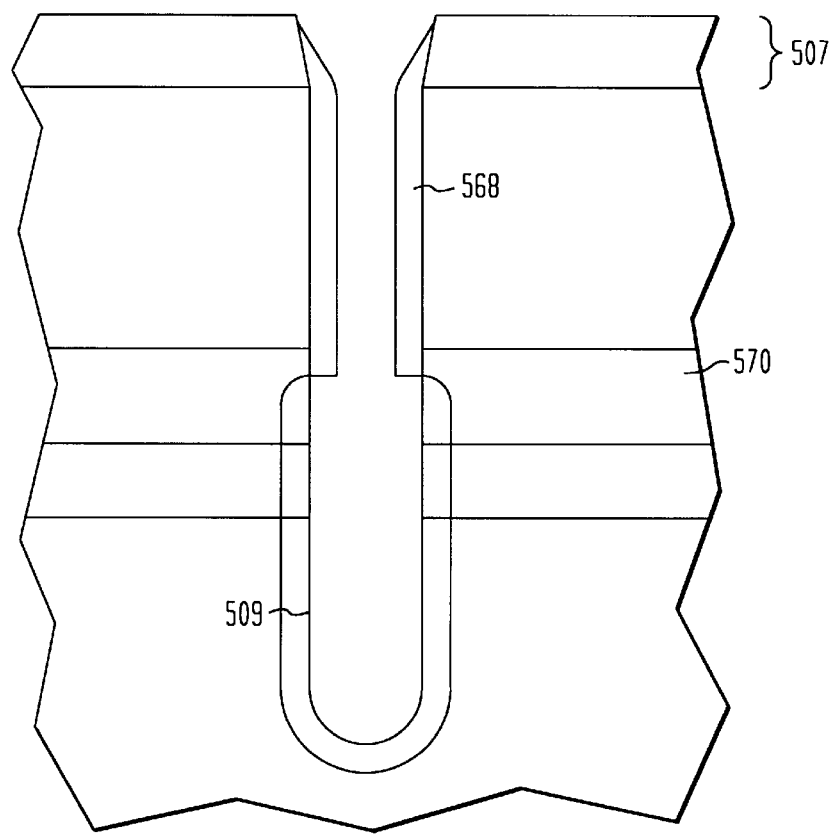

FIGS. 5a–c show a process for forming the collar prior to forming the epi buried plate. Such process is described in copending U.S. patent application Ser. No. 09/055,506 (attorney docket number 98 P 7491), titled "TRENCH CAPACITOR WITH ISOLATION COLLAR," which is herein incorporated by reference for all purposes. As shown in FIG. 5a, a semiconductor substrate 501 is provided. The substrate, for example, comprises silicon. Other types of substrates are also useful. The substrate includes a buried well 570. On the surface of the substrate is a pad stack 507 comprising various pad layers as pad oxide, a pad nitride, and a hard mask layer. The pad stack is patterned to define a region in which a trench 509 is formed by RIE. The trench is filled with a sacrificial material 511, such as poly or amorphous silicon. Other sacrificial materials that are stable up to about 1050–1100° C. are also useful. The sacrificial material is recessed to a depth equal to the bottom of the collar.

A dielectric layer 567 is deposited, lining the sidewalls of the trench and surface of the sacrificial material. The dielectric layer comprises, for example, oxide to serve as the collar oxide. In one embodiment, the dielectric layer is formed by first growing a thin layer of thermal oxide, by depositing a layer of TEOS thereover. The thickness of the oxide is about, for example, 5–10 nm and the collar is about 20–50 nm thick. Alternatively, the dielectric layer comprises thermal oxide. A nitride liner may be formed over the dielectric layer. Other types of dielectric to serve as the collar are also useful.

Referring to FIG. 5b, a collar open etch is performed to expose the sacrificial material 511. An anisotropic etch such as a RIE is used to open the collar. The RIE also removes the dielectric layer from the surface of the pad stack and top of the sacrificial material 511, leaving the dielectric layer remaining on the silicon sidewall to form a collar 568. As depicted, the upper portion of the dielectric layer lining the trench sidewalls is tapered as a result of erosion from the RIE. However, since the collar will subsequently be recessed to below the substrate surface past the point of the taper, the taper does not adversely affect the functionality of the collar.

Referring to FIG. 5c, the sacrificial material 511 is removed by, for example, a wet etch in order to expose the trench sidewalls in the lower portion of the trench. The process continues as described in FIGS. 4a–f.

Alternatively, the collar can be formed by LOCOS oxidation. LOCOS oxidation techniques are described in, for example, U.S. Pat. No. 5,656,535, which is herein incorporated by reference for all purposes. In such techniques, a nitride layer is deposited after the trench is formed. The nitride layer lines the trench sidewalls. The nitride layer is sufficiently thick to protect the trench sidewalls from being oxidized. Typically, the nitride layer is about 50 A thick. Resist is then deposited and recessed to about the bottom of the collar, exposing the nitride layer in the upper portion of the trench. A wet etch removes the exposed nitride. The resist is removed, leaving the nitride layer lining the bottom portion of the trench. LOCOS oxidation is then employed to form the oxide collar in the exposed trench sidewalls in the upper portion of the trench. The thickness of the LOCOS collar is, for example, about 20–30 nm. The process continues as described in FIGS. 4a–f.

Figure 6A:
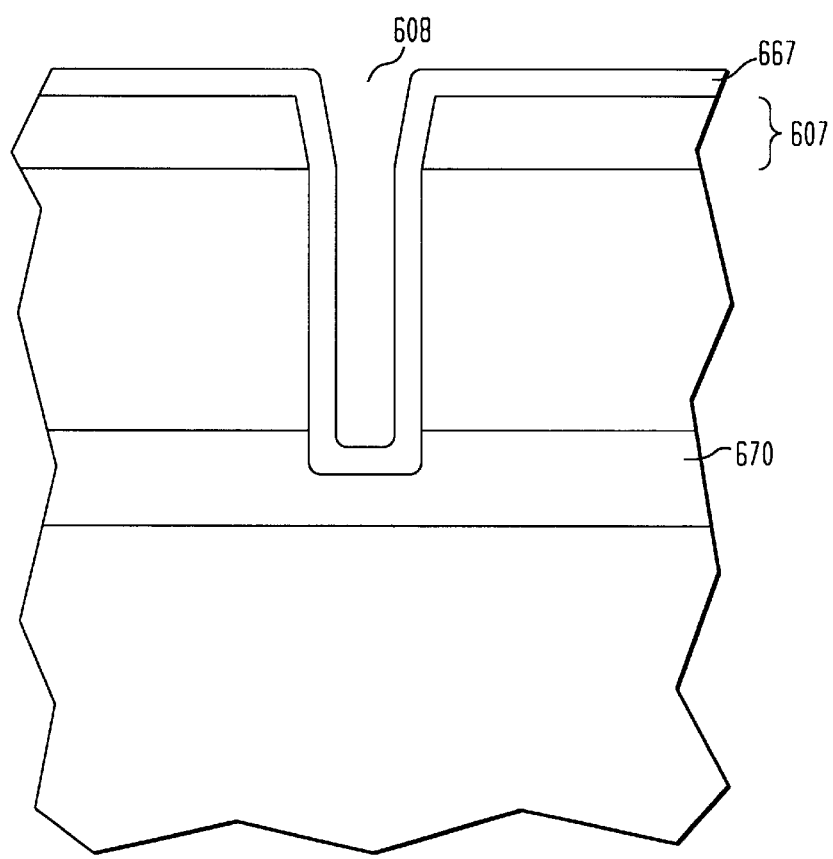
FIGS. 6a–c show another process for forming a collar in accordance with the invention.
Figure 6B:
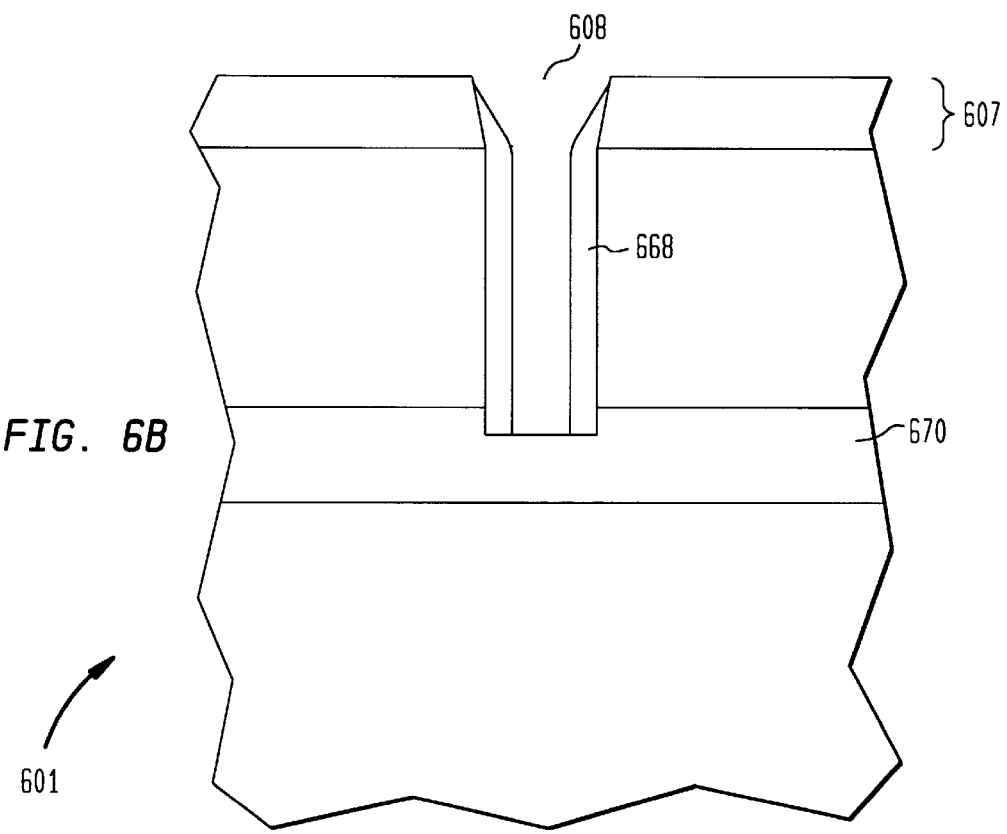
Figure 6C:
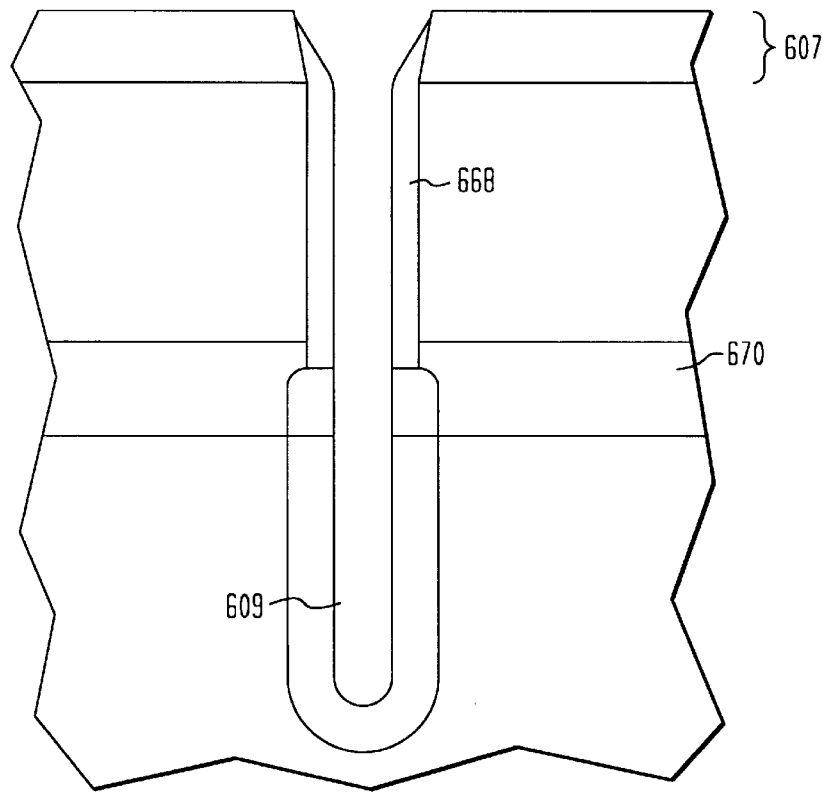

FIGS. 6a–c show another process for forming the collar prior to forming the epi buried plate. As shown in FIG. 6a, a semiconductor substrate 601 is provided. The substrate, for example, comprises silicon. Other types of substrates, such as p-substrates, are also useful. The substrate includes a buried well 670. On the surface of the substrate is a pad stack 607 comprising various pad layers such as pad oxide, pad nitride, and a hard mask layer. The pad stack is patterned to define a region in which a trench is formed by RIE.

The defined region is then etched by, for example, reactive ion etching (RIE), to form an opening in the pad stack to expose the substrate. The exposed substrate is etched to a depth that defines about the bottom of the collar, forming a trench 608. In one embodiment, the opening 608 is etched to a depth of about 1–1.5 $\mu$m. Of course, this depth varies depending on design requirements.

A dielectric layer 667 is deposited, lining the sidewalls and bottom of the trench. The dielectric layer comprises, for example, oxide to serve as the collar oxide. In one embodiment, the dielectric layer is formed by first growing a thin layer of thermal oxide to a thickness of about 5–10 nm, followed by depositing a layer of TEOS thereover. Typically, the collar is about 20–50 nm thick. Alternatively, the dielectric layer comprises thermal oxide. A nitride liner may be formed over the dielectric layer. Other types of dielectric to serve as the collar are also useful.

Referring to FIG. 6b, a collar open etch is performed to expose the substrate at the bottom surface of trench 608. An anisotropic etch such as a RIE is used to open the collar. The RIE also removes the dielectric layer from the surface of the pad stack and bottom of the trench 608, leaving the dielectric layer remaining on the silicon sidewall to form a collar 668. As depicted, the upper portion of the dielectric layer lining the trench sidewalls of opening 608 is tapered as a result of erosion from the RIE. However, since the collar will subsequently be recessed to below the substrate surface past the point of the taper, the taper does not adversely affect the functionality of the collar.

Referring to FIG. 6c, an RIE is performed. The RIE etches the exposed substrate surface at the bottom of trench, extending its depth. The RIE etches the substrate to form a bottom portion 669 of the trench 609. Typically, the trench is about 6–8 $\mu$m below the surface of the substrate. Of course, the depth of the trench depends on design requirements as well as processing capabilities. The hard mask layer may be removed after the formation of the trench. Alternatively, the hard mask can be removed later on in the process flow. Typically, the hard mask is removed by a wet etch. The process continues as described in FIGS. 4a–f.

EXPERIMENTS

Experiments are conducted to determine dopant concentration of the diffusion region surrounding the bottom portion of the trench. In one experiment, trenches were etched and phosphorus PIII doped under various conditions. The trenches were about 6 um deep, with an opening of about 175×350 um. In the upper portion of the trenches is a collar oxide of about 30 nm thick. The parameters under which the PIII doping were performed are listed in Table I. After PIII doping, the trenches were filled with undoped poly. The dopant concentration was measured by top-down secondary mass spectroscopy (SIMS). The results are listed also in Table I.

TABLE I

| Doping Energy (KeV) | Pressure (mTorr) | Dopant Concentration (ions/cm$^3$) | Dose (ions/cm$^2$) |
| --- | --- | --- | --- |
| 1 | 15 | 4.6 × 10$^{19}$ | 9 × 10$^{14}$ |
| 5 | 15 | 8.6 × 10$^{19}$ | 3 × 10$^{15}$ |
| 8 | 15 | 7.8 × 10$^{19}$ | 2 × 10$^{15}$ |
| 1 | 150 | 4.7 × 10$^{19}$ | 9 × 10$^{14}$ |
| 5 | 150 | 4.7 × 10$^{19}$ | 9 × 10$^{14}$ |
| 8 | 150 | 6.9 × 10$^{19}$ | 1 × 10$^{15}$ |

In another experiment, a silicon substrate was doped with arsenic by PIII under various conditions. A TEOS layer was formed over the substrate and annealed by rapid thermal process (RTP) at 950° C. for about 10 sec. The parameters under which the PIII doping were performed are listed in Table II. The dopant concentration was measured by top-down SIMS. The results are listed also in Table II.

TABLE II

| Doping Energy (KeV) | Pressure (mTorr) | Dopant Concentration (ions/cm$^3$) | Dose (ions/cm$^2$) |
| --- | --- | --- | --- |
| 1 | 10–15 | 8 × 10$^{19}$ | 3.2 × 10$^{15}$ |
| 5 | 10–15 | 2 × 10$^{20}$ | 1 × 10$^{16}$ |
| 8 | 10–15 | 2 × 10$^{20}$ | 2.3 × 10$^{16}$ |
| 1 | 100–150 | 9 × 10$^{19}$ | 2.9 × 10$^{15}$ |
| 5 | 100–150 | 9 × 10$^{19}$ | 2.9 × 10$^{15}$ |
| 8 | 100–150 | 9 × 10$^{19}$ | 1.6 × 10$^{16}$ |

While the invention has been particularly shown and described with reference to various embodiments, it will be recognized by those skilled in the art that modifications and changes may be made to the present invention without departing from its scope. Merely by way of example, the trench capacitor may be formed with a surface strap or other cell or bitline configurations may be employed. The scope of the invention should therefore be determined not with reference to the above description but with reference to the appended claims along with their full scope of equivalents.

What is claimed is:

1. A semiconductor integrated circuit comprising:

a trench capacitor, wherein the trench capacitor comprises an epitaxial layer lining the lower portion of sidewalls of a trench below an oxide collar which lines an upper portion of the trench, the epitaxial layer abutting the oxide collar in the trench such that the oxide collar and the epitaxial layer do not overlap on the sidewalls of the trench; and a diffusion region surrounding the lower portion of the trench.

2. The semiconductor integrated circuit as recited in claim 1, wherein the trench capacitor is formed in a substrate, the substrate having a dopant concentration and the diffusion region having a dopant concentration greater than the substrate dopant concentration.

3. The semiconductor integrated circuit as recited in claim 1, further comprises a continuous dielectric layer formed on the epitaxial layer and the oxide collar.

4. The semiconductor integrated circuit as recited in claim 1, wherein the epitaxial layer includes a reduced surface roughness over a roughness of the trench sidewalls such that improved capacitor breakdown voltage is provided.

5. The semiconductor integrated circuit as recited in claim 1, wherein the epitaxial layer is substantially defectless such that improved capacitor breakdown voltage is provided.

6. The semiconductor integrated circuit as recited in claim 1, wherein the diffusion region has dopants provided by one of a gas phased doping, a plasma doping and a plasma immersion ion implantation.

7. The semiconductor integrated circuit as recited in claim 1, wherein the epitaxial layer includes polysilicon.

8. The semiconductor integrated circuit as recited in claim 1, wherein the epitaxial layer is comprised of a plurality of epitaxial layers.

9. The semiconductor integrated circuit as recited in claim 1, wherein the diffusion region includes a dopant concentration of greater than about $1 \times 10^{18}$ atoms/cc.

10. The semiconductor integrated circuit as recited in claim 1, wherein the diffusion region includes a surface junction depth of about 0.1 times to about 0.7 times a minimum feature size.

* * * * *